(12) United States Patent
Wang

(10) Patent No.: US 12,713,549 B2
(45) Date of Patent: Aug. 18, 2026

(54) ELECTRONIC DEVICE AND CABLE CLIP THEREOF

(71) Applicant: Wiwynn Corporation, New Taipei City (TW)

(72) Inventor: Yen-Hsiang Wang, New Taipei City (TW)

(73) Assignee: Wiwynn Corporation, New Taipei City (TW)

( * ) Notice: Subject to any disclaimer, the term of this patent is extended or adjusted under 35 U.S.C. 154(b) by 130 days.

(21) Appl. No.: 18/624,017

(22) Filed: Apr. 1, 2024

(65) Prior Publication Data

US 2025/0031332 A1 Jan. 23, 2025

(30) Foreign Application Priority Data

Jul. 17, 2023 (TW) ................................ 112126485

(51) Int. Cl.

*F16M 11/00* (2006.01)
*H05K 5/02* (2006.01)
*H05K 7/12* (2006.01)

(52) U.S. Cl.

CPC ............. *H05K 7/12* (2013.01); *H05K 5/0247* (2013.01)

(58) Field of Classification Search

CPC ...... H05K 7/12; H05K 5/0247; H05K 7/1491; B65H 75/16; B65H 2701/34

See application file for complete search history.

(56) References Cited

U.S. PATENT DOCUMENTS 5,277,006 A * 1/1994 Ruster .................... H02G 3/288 174/99 R
6,622,946 B2 * 9/2003 Held .................... B05C 5/0275 239/562
6,885,805 B2 * 4/2005 Asada ................. G02B 6/4459 385/137
11,261,891 B2 * 3/2022 Leutwyler ................. F15D 1/04
11,473,540 B2 * 10/2022 Ryu ...................... F16L 39/005
2014/0283341 A1 * 9/2014 Zhou ......................... G06F 1/18 24/16 R
2022/0210941 A1 * 6/2022 Knychalski .......... G02B 6/4457

FOREIGN PATENT DOCUMENTS

CN 207603118 U 7/2018
CN 113036694 A 6/2021
CN 218634560 U 3/2023
JP 2008-104304 5/2008
JP 2017-131010 7/2017
WO 2019/110979 A1 6/2019

* cited by examiner

*Primary Examiner* — Amy J. Sterling
(74) *Attorney, Agent, or Firm* — Winston Hsu

(57) ABSTRACT

An electronic device includes a chassis, a support bracket and a cable clip. The support bracket is disposed in the chassis. The cable clip includes a retainer and a fixing structure. The retainer is curved with a radian and formed with a curved accommodation space. The fixing structure extends from a back of the retainer. The cable clip is fixed on the support bracket by the fixing structure.

18 Claims, 12 Drawing Sheets

ELECTRONIC DEVICE AND CABLE CLIP THEREOF

BACKGROUND OF THE INVENTION

1. Field of the Invention

The invention relates to a cable clip and, more particularly, to a cable clip capable of being operated easily and not occupying space and an electronic device equipped with the cable clip.

2. Description of the Prior Art

As technology advances and develops, various electronic devices (e.g. computer, server, etc.) are considered a necessity by a lot of people in their daily lives. In general, there are various electronic components disposed in the electronic device to provide various functions for the electronic device. Lots of electronic components are connected to a circuit board by cables. To avoid the cables being too cluttered, a cable management mechanism is usually installed in the electronic device to fix and protect the cables. However, the conventional cable management mechanism cannot fix a bending radius of the cable, and the signal quality is easily affected by the bending radius. Thus, additional inspection time is required to ensure that the bending radius of the cable is acceptable. Furthermore, the space in the electronic device is limited, such that it is unbeneficial for cable management.

SUMMARY OF THE INVENTION

According to an embodiment of the invention, an electronic device comprises a chassis, a support bracket and a cable clip. The support bracket is disposed in the chassis. The cable clip comprises a retainer and a fixing structure. The retainer is curved with a radian and formed with a curved accommodation space. The fixing structure extends from a back of the retainer. The cable clip is fixed on the support bracket by the fixing structure.

According to another embodiment of the invention, a cable clip comprises a retainer and a fixing structure. The retainer is curved with a radian and formed with a curved accommodation space. The fixing structure extends from a back of the retainer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
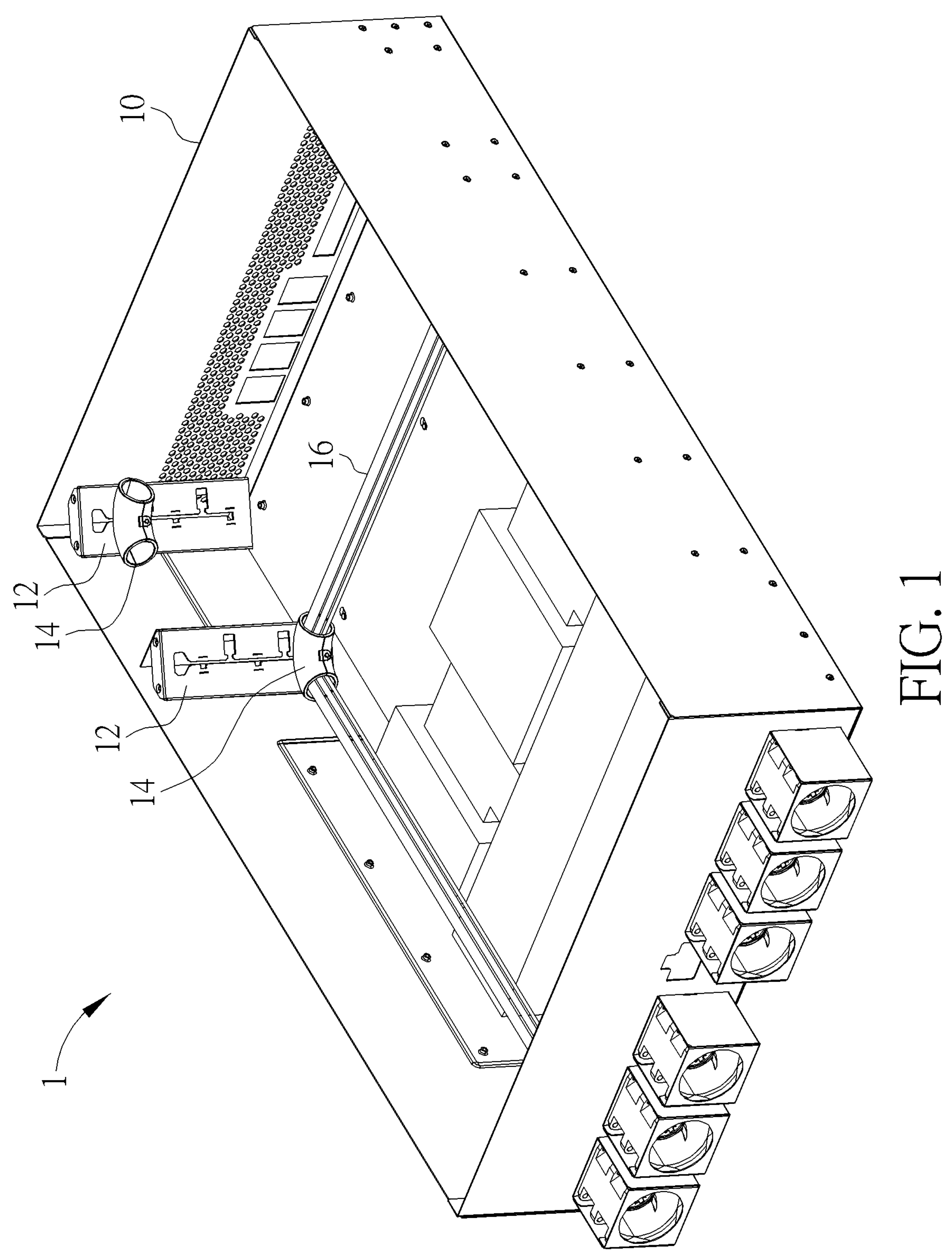
FIG. 1 is a perspective view illustrating an electronic device according to an embodiment of the invention.
Figure 2:
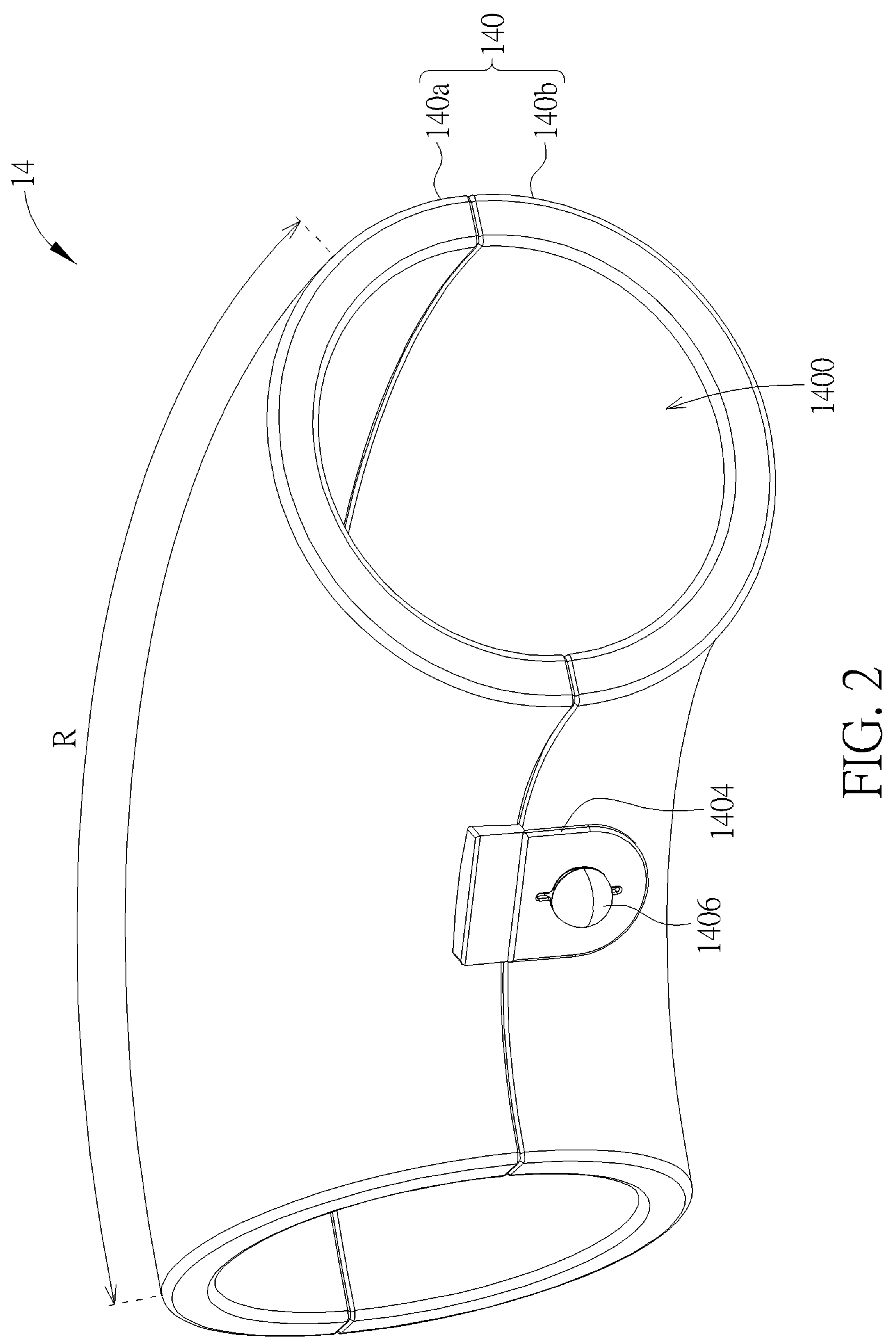
FIG. 2 is a perspective view illustrating a cable clip shown in FIG. 1.
Figure 3:
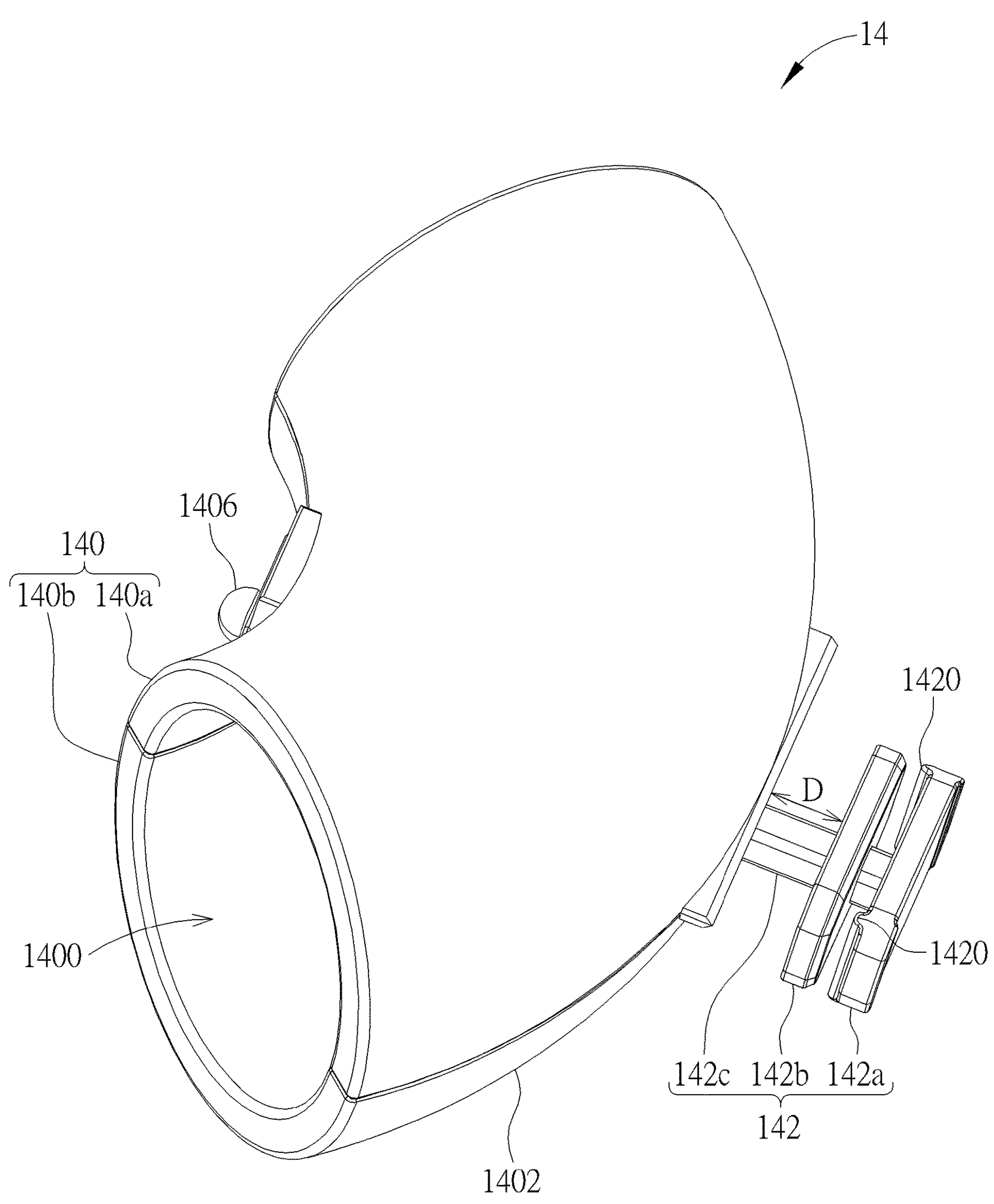
FIG. 3 is a perspective view illustrating the cable clip shown in FIG. 2 from another viewing angle.
Figure 4:
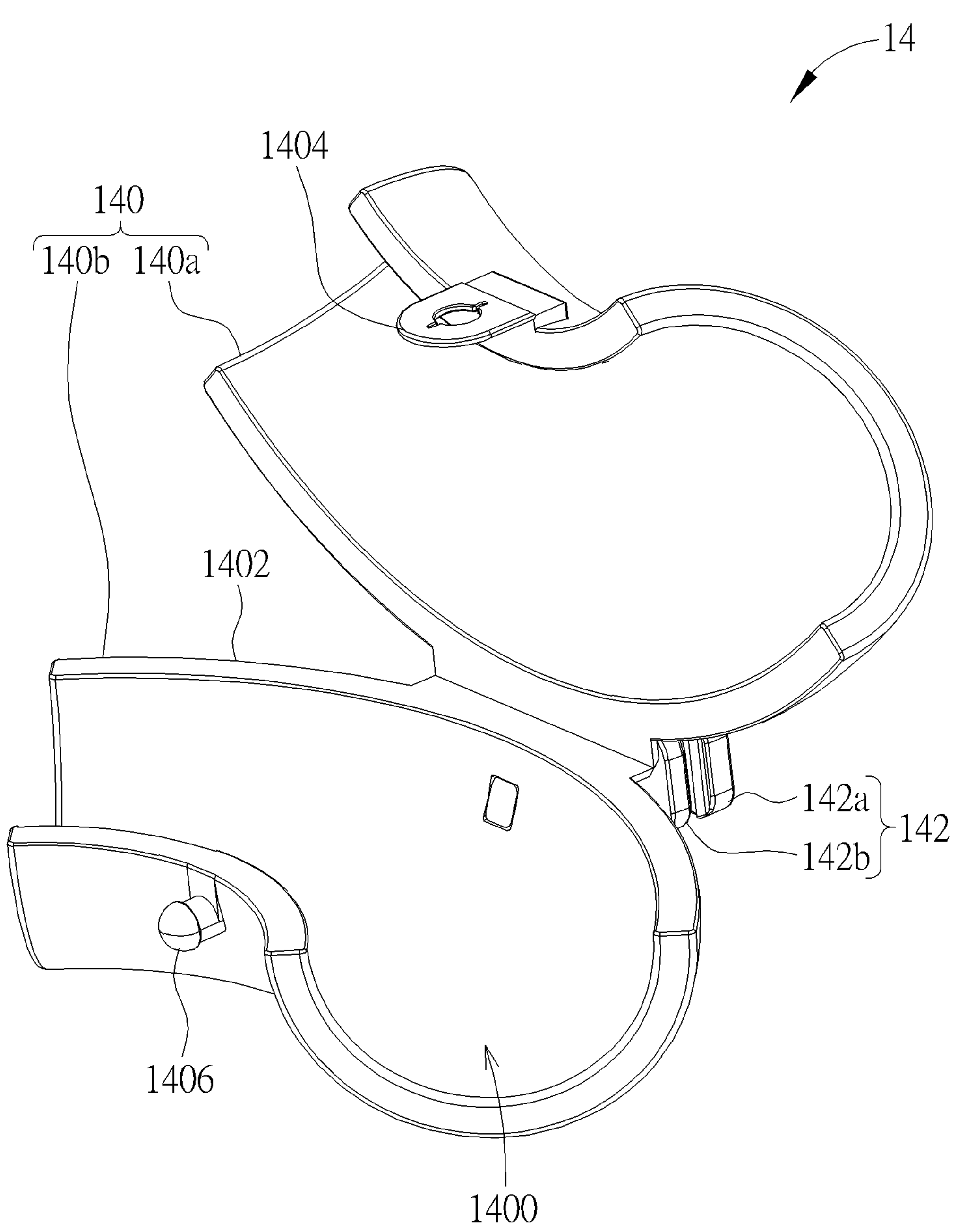
FIG. 4 is a perspective view illustrating the cable clip shown in FIG. 2 being opened.
Figure 5:
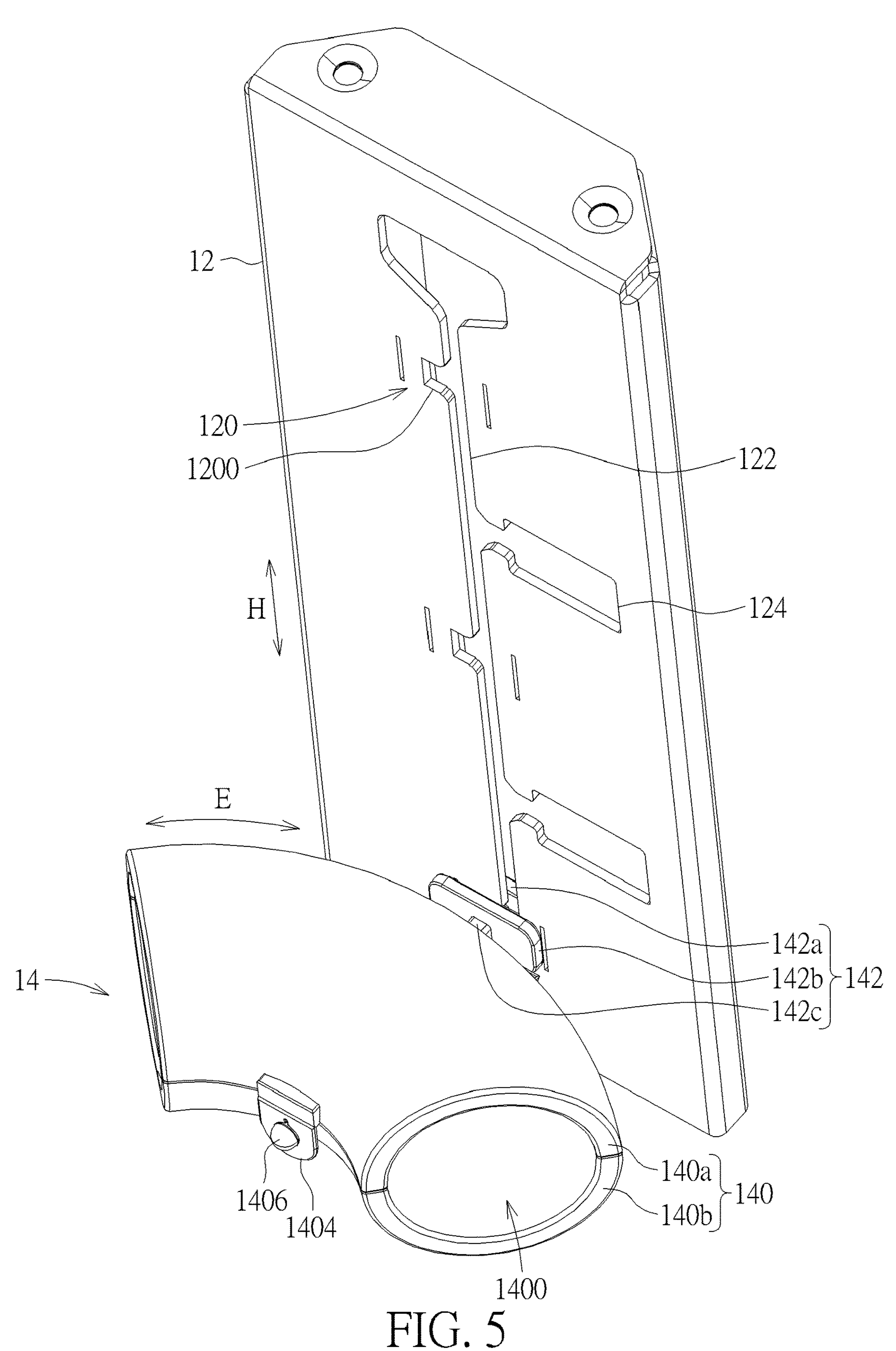
FIG. 5 is a perspective view illustrating the cable clip shown in FIG. 2 being fixed on a support bracket.
Figure 6:
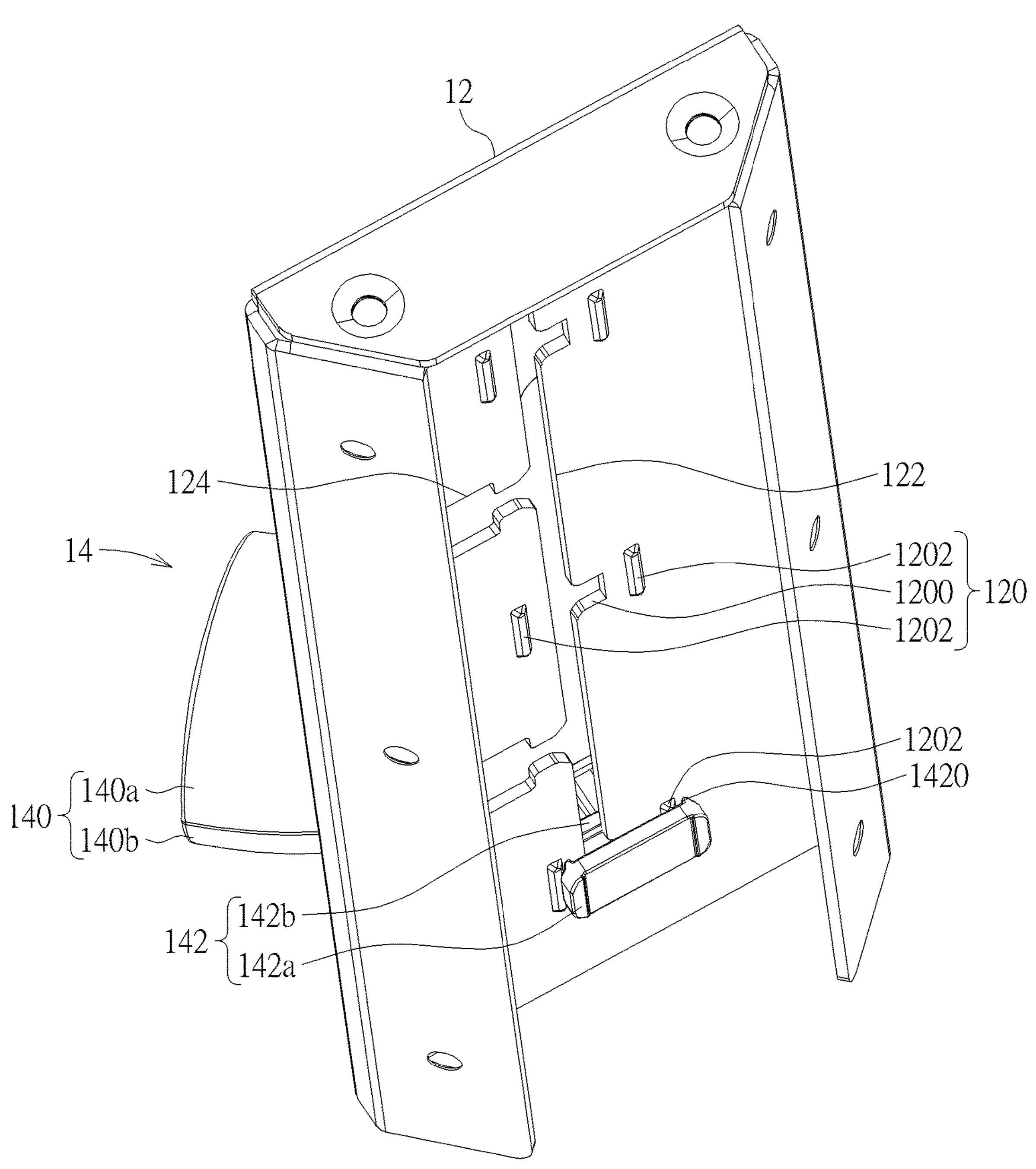
FIG. 6 is a perspective view illustrating the cable clip and the support bracket shown in FIG. 5 from another viewing angle.
Figure 7:
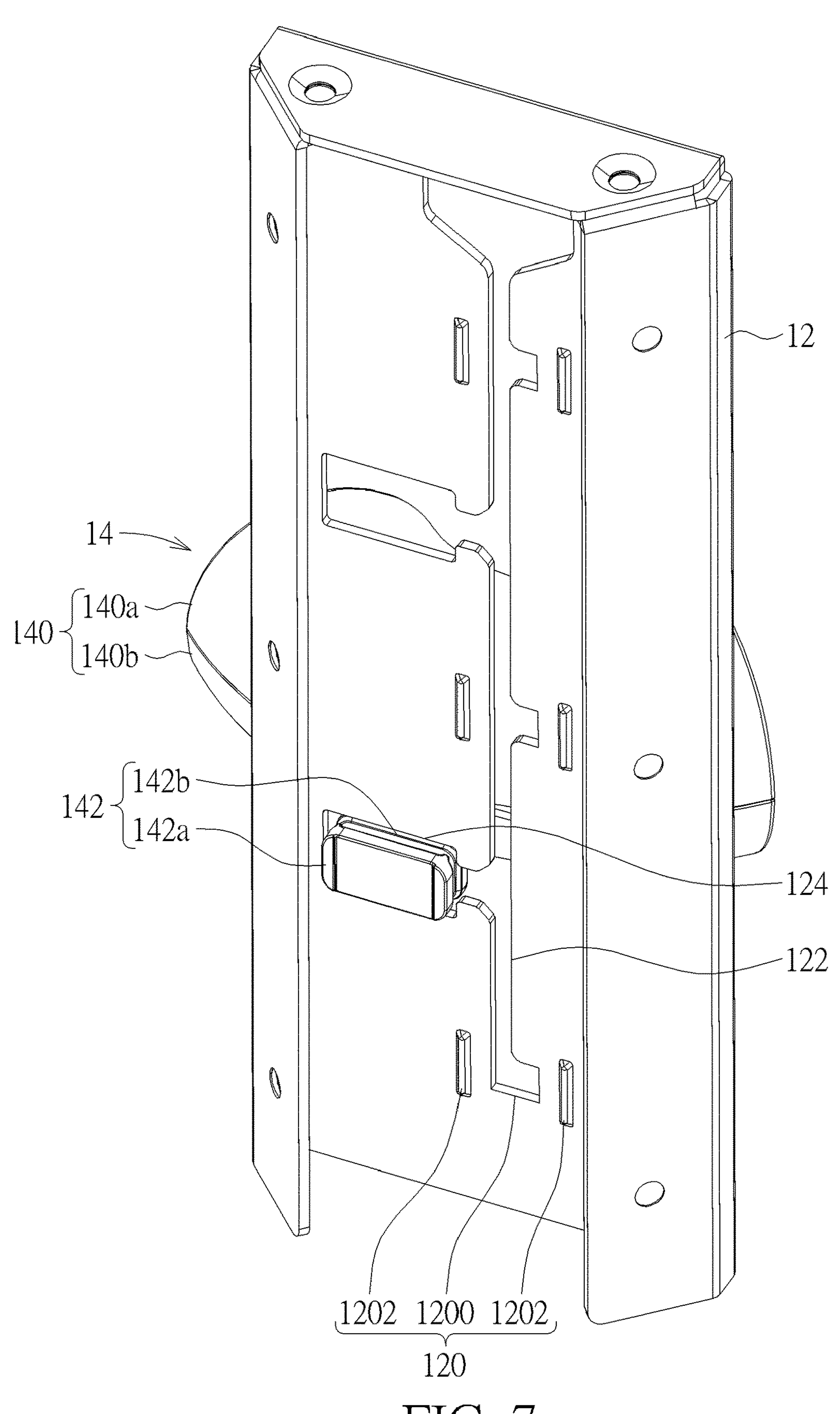
FIG. 7 is a perspective view illustrating the cable clip shown in FIG. 6 moving to a quick release groove.

Referring to FIGS. 1 to 7, FIG. 1 is a perspective view illustrating an electronic device 1 according to an embodiment of the invention, FIG. 2 is a perspective view illustrating a cable clip 14 shown in FIG. 1, FIG. 3 is a perspective view illustrating the cable clip 14 shown in FIG. 2 from another viewing angle, FIG. 4 is a perspective view illustrating the cable clip 14 shown in FIG. 2 being opened, FIG. 5 is a perspective view illustrating the cable clip 14 shown in FIG. 2 being fixed on a support bracket 12, FIG. 6 is a perspective view illustrating the cable clip 14 and the support bracket 12 shown in FIG. 5 from another viewing angle, and FIG. 7 is a perspective view illustrating the cable clip 14 shown in FIG. 6 moving to a quick release groove 124.

As shown in FIG. 1, the electronic device 1 comprises a chassis 10, a support bracket 12 and a cable clip 14. The support bracket 12 is disposed in the chassis 10 and the cable clip 14 is fixed on the support bracket 12. The cable clip 14 is configured to accommodate a cable 16 and fix a bending radius of the cable 16, so as to ensure the signal quality of the cable 16. In practical applications, the cable clip may be configured to accommodate one or more cables 16. For example, the cable clip 14 shown in FIG. 1 accommodates three cables 16. It should be noted that the number and diameter of the cables 16 may be determined according to practical applications, so the invention is not limited to the embodiment shown in the figure. The electronic device 1 may be a computer, a server, or other electronic devices according to practical applications. In general, the electronic device 1 may be further equipped with some necessary hardware and/or software components for specific purposes, such as processor, memory, power supply, applications, communication module, etc., and it depends on practical applications. In this embodiment, two support brackets 12 may be disposed in the chassis 10, wherein each of the support brackets 12 may be disposed at a corner or any suitable position of the chassis 10. It should be noted that the number and position of the support brackets 12 and the cable clips 14 may be determined according to practical applications, so the invention is not limited to the embodiment shown in the figure.

As shown in FIGS. 2 to 4, the cable clip 14 comprises a retainer 140 and a fixing structure 142. The retainer 140 is curved with a radian R and formed with a curved accommodation space 1400. It should be noted that the size of the curved accommodation space 1400 may be determined according to the number and diameter of the cables 16, so the invention is not limited to the embodiment shown in the figure. In this embodiment, the radian R of the retainer 140 may be, but is not limited to, $\pi/2$. In practical applications, the radian R of the retainer 140 may be between $\pi/2$ and n depending on the required bending radius of the cable 16 (as shown in FIG. 1). The fixing structure 142 extends from a back 1402 of the retainer 140. The cable clip 14 is fixed on the support bracket 12 by the fixing structure 142 (as shown in FIGS. 5 and 6).

In this embodiment, the retainer 140 may comprise a first cover 140*a* and a second cover 140*b*, wherein the first cover 140*a* is rotatably connected to the second cover 140*b*, such that the first cover 140*a* is able to rotate with respect to the second cover 140*b* to be opened or closed to expose or cover the curved accommodation space 1400, as shown in FIGS. 4 and 2. Furthermore, the first cover 140*a* may have a first engaging portion 1404 and the second cover 140*b* may have a second engaging portion 1406, wherein a position of the first engaging portion 1404 corresponds to a position of the second engaging portion 1406. When the first cover 140*a* is closed with respect to the second cover 140*b*, the first engaging portion 1404 engages with the second engaging portion 1406, as shown in FIG. 2. In this embodiment, the first engaging portion 1404 may be an elastic arm formed with an engaging hole, and the second engaging portion 1406 may be an engaging protrusion capable of engaging with the engaging hole. Thus, when the first cover 140*a* shown in FIG. 4 rotates toward the second cover 140*b* to be closed, the first engaging portion 1404 is pushed by the second engaging portion 1406 to elastically deform slightly outward. After the second engaging portion 1406 is aligned with the engaging hole of the first engaging portion 1404, the second engaging portion 1406 engages into the engaging hole of the first engaging portion 1404, such that the first engaging portion 1404 engages with the second engaging portion 1406, as shown in FIG. 2. On the other hand, a user may first pull the first engaging portion 1404 outward to disengage the first engaging portion 1404 from the second engaging portion 1406. Then, the user may rotate the first cover 140*a* with respect to the second cover 140*b* to be opened to expose the curved accommodation space 1400, as shown in FIG. 4. Then, the user may put the cable 16 into the curved accommodation space 1400. Afterwards, the user may rotate the first cover 140*a* with respect to the second cover 140*b* to be closed to cover the curved accommodation space 1400 and the cable 16 therein and make the first engaging portion 1404 engage with the second engaging portion 1406. Accordingly, the cable 16 is stably fixed in the curved accommodation space 1400. Since the retainer 140 is curved with the radian R, the bending radius of the cable 16 accommodated in the curved accommodation space 1400 is fixed by the radian R. Therefore, the user may use the cable clip 14 to accommodate the cable 16 easily and fix the bending radius of the cable 16, so as to ensure the signal quality of the cable 16.

In this embodiment, the fixing structure 142 may comprise a first plate 142*a*, a second plate 142*b* and a connecting portion 142*c*, wherein the first plate 142*a* and the second plate 142*b* are disposed on the connecting portion 142*c* in parallel. The first plate 142*a* may have two first restraining portions 1420, wherein the two first restraining portions 1420 are located at opposite sides of the connecting portion 142*c*. The connecting portion 142*c* is connected to the back 1402 of the retainer 140, and the second plate 142*b* is spaced a predetermined distance D from the back 1402 of the retainer 140, as shown in FIG. 3. Thus, when the first cover 140*a* is opened with respect to the second cover 140*b*, the predetermined distance D may prevent the first cover 140*a* from interfering with the second plate 142*b*. In this embodiment, the first restraining portion 1420 may be, but is not limited to, a protruding rib.

In this embodiment, the support bracket 12 may have a plurality of fixing mechanisms 120, wherein the fixing mechanisms 120 are arranged at intervals along a height direction H of the support bracket 12, as shown in FIGS. 5 to 7. Each of the fixing mechanisms 120 is formed with an installation groove 1200 and has two second restraining portions 1202, wherein the two second restraining portions 1202 are located at opposite sides of the installation groove 1200. In this embodiment, the second restraining portion 1202 may be, but is not limited to, a protruding rib. Furthermore, the support bracket 12 may further be formed with a longitudinal groove 122, wherein the longitudinal groove 122 is connected to the installation groove 1200 of each of the fixing mechanisms 120. Still further, the support bracket 12 may further be formed with at least one quick release groove 124, wherein the at least one quick release groove 124 is connected to the longitudinal groove 122. In this embodiment, the support bracket 12 may have three fixing mechanisms 120 and three quick release grooves 124, but the invention is not so limited. The number, position and shape of the fixing mechanisms 120 and the quick release grooves 124 may be determined according to practical applications, so the invention is not limited to the embodiment shown in the figure.

The first plate 142*a* of the fixing structure 142 is able to pass through the quick release groove 124 of the support bracket 12, such that the connecting portion 142*c* of the fixing structure 142 is able to move between the longitudinal groove 122, the quick release groove 124 and the installation groove 1200 of the support bracket 12. For further explanation, when a user wants to install the cable clip 14 on the support bracket 12, the user may first pass the first plate 142*a* of the fixing structure 142 through the quick release groove 124 of the support bracket 12, as shown in FIG. 7. Then, the connecting portion 142*c* of the fixing structure 142 is able to move from the quick release groove 124 to the installation groove 1200 through the longitudinal groove 122. Thus, the user may move the cable clip 14 to the position shown in FIGS. 5 and 6, such that the connecting portion 142*c* of the fixing structure 142 is installed in the installation groove 1200. When the connecting portion 142*c* of the cable clip 14 is installed in the installation groove 1200, the two second restraining portions 1202 will s stop the two first restraining portions 1420 to prevent the cable clip 14 from coming off the installation groove 1200. At this time, the support bracket 12 is sandwiched in between the first plate 142*a* and the second plate 142*b* of the fixing structure 142. Accordingly, the cable clip 14 can be fixed on the support bracket 12 by the fixing structure 142. As shown in FIG. 5, when the cable clip 14 is fixed on the support bracket 12, an extending direction E of the curved accommodation space 1400 of the cable clip 14 is perpendicular to the height direction H of the support bracket 12.

When the user wants to detach the cable clip 14 from the support bracket 12, the user may move the cable clip 14 from the installation groove 1200 to the quick release groove 124 through the longitudinal groove 122, as the position shown in FIG. 7. Then, the user may take out the cable clip 14 from the quick release groove 124. Accordingly, the user may quickly and conveniently assemble and disassemble the cable clip 14 without using additional tools. Furthermore, the user may first arrange the cable 16 with the cable clip 14 outside the chassis 10 and then fix the cable clip 14 on the support bracket 12 in the chassis 10, so as to increase the operating space when repairing or replacing the cable 16. Moreover, the cable clip 14 may be clamped at any position on the support bracket 12 by the first plate 142*a* and the second plate 142*b* (e.g. the position of any installation groove 1200), so as to increase the flexibility of cable management.

In another embodiment, the aforesaid first restraining portion 1420 and second restraining portion 1202 may also be omitted. At this moment, the first plate 142*a* may be directly in contact with the support bracket 12. The cable clip 14 may be adjusted to any position on the support bracket 12 by the friction between the first pate 142*a*, the second plate 142*b* and the support bracket 12.

Figure 8:
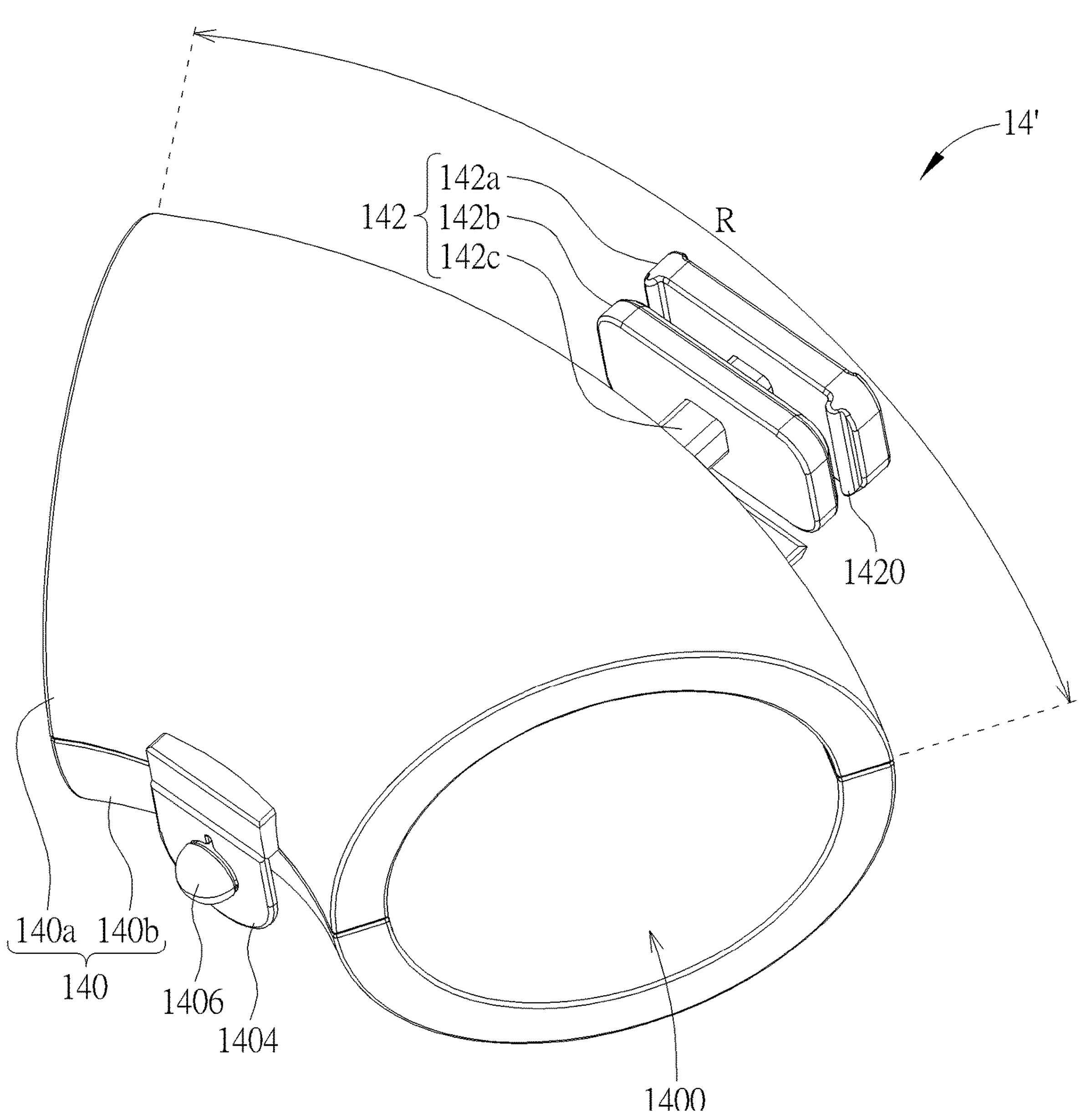
FIG. 8 is a perspective view illustrating a cable clip according to another embodiment of the invention.

Referring to FIG. 8, FIG. 8 is a perspective view illustrating a cable clip 14' according to another embodiment of the invention.

The main difference between the cable clip 14' and the aforesaid cable clip 14 is that the radian R of the retainer 140 of the cable clip 14' may be 2π/3, as shown in FIG. 8. As mentioned in the above, the radian R of the retainer 140 may be between π/2 and π depending on the required bending radius of the cable 16 (as shown in FIG. 1).

Figure 9:
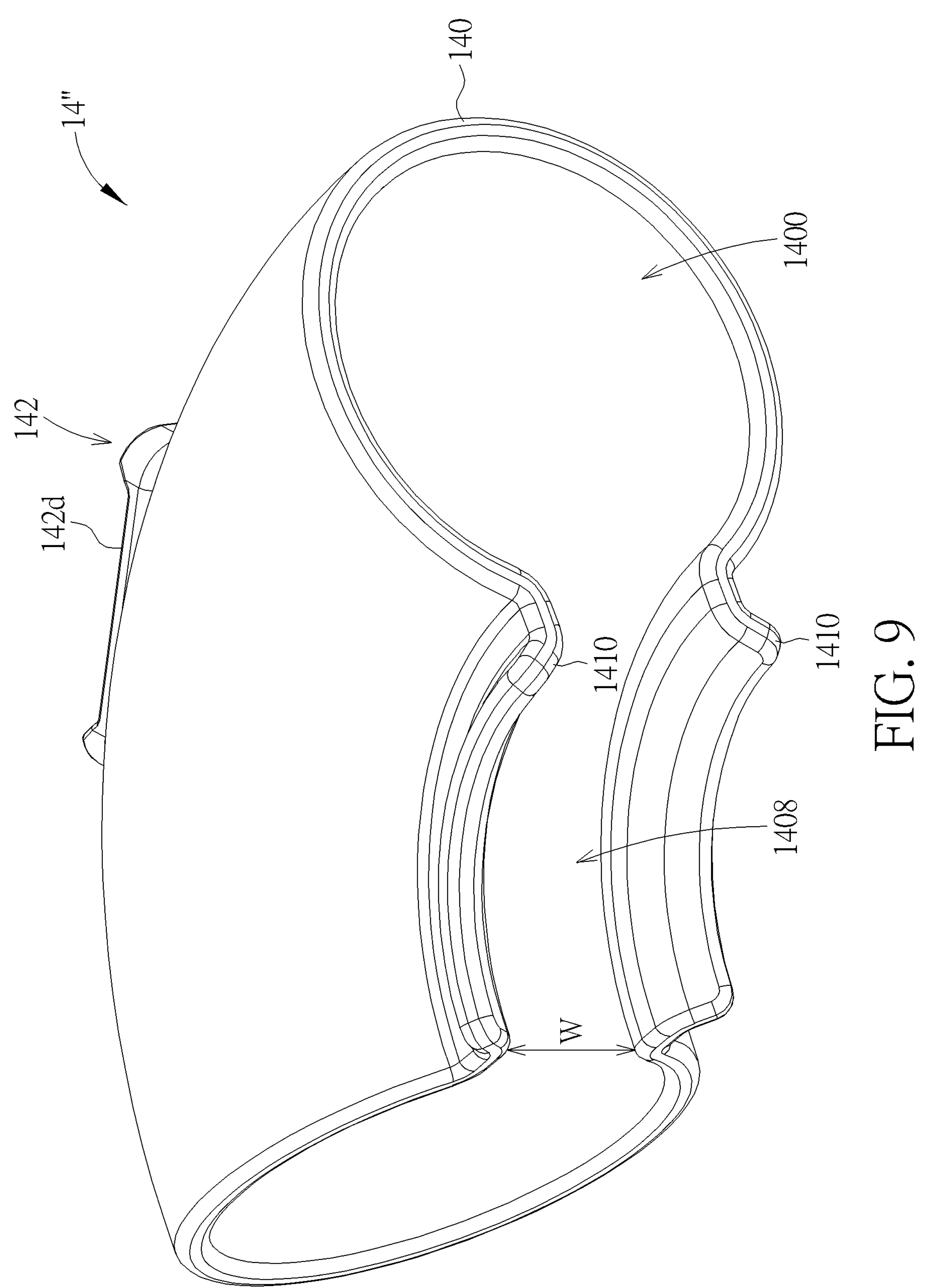
FIG. 9 is a perspective view illustrating a cable clip according to another embodiment of the invention.
Figure 10:
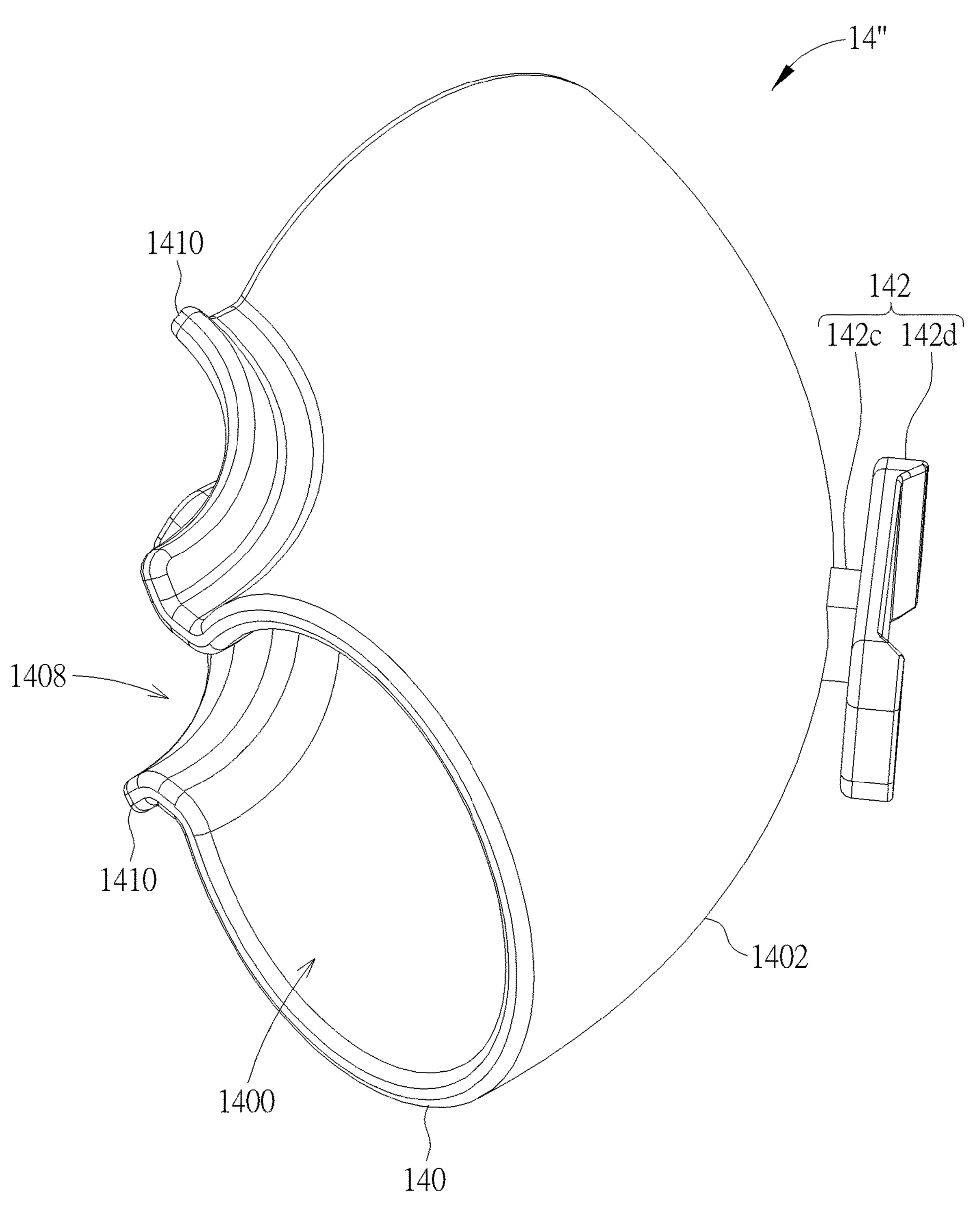
FIG. 10 is a perspective view illustrating the cable clip shown in FIG. 9 from another viewing angle.
Figure 11:
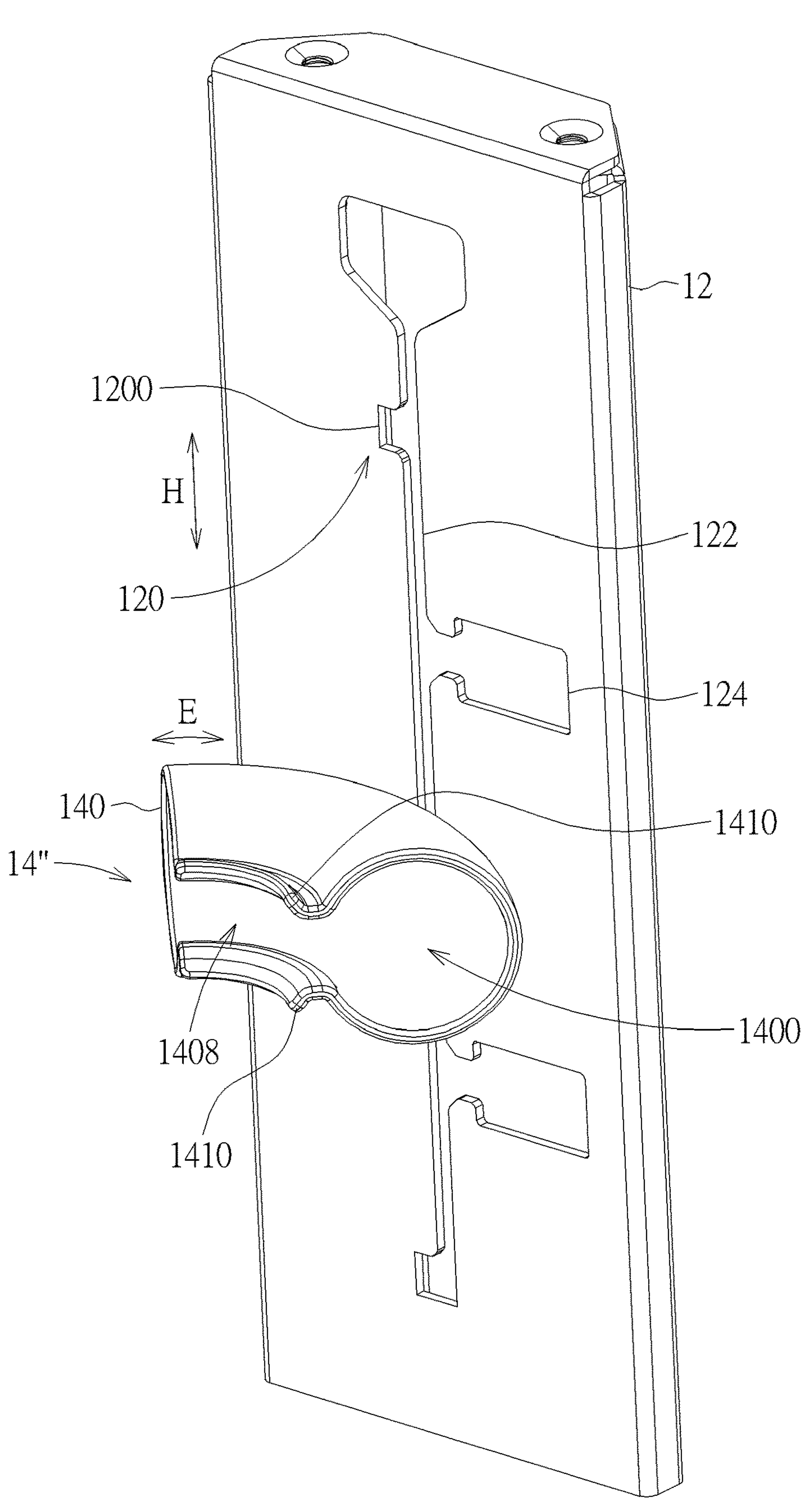
FIG. 11 is a perspective view illustrating the cable clip shown in FIG. 9 being fixed on the support bracket.
Figure 12:
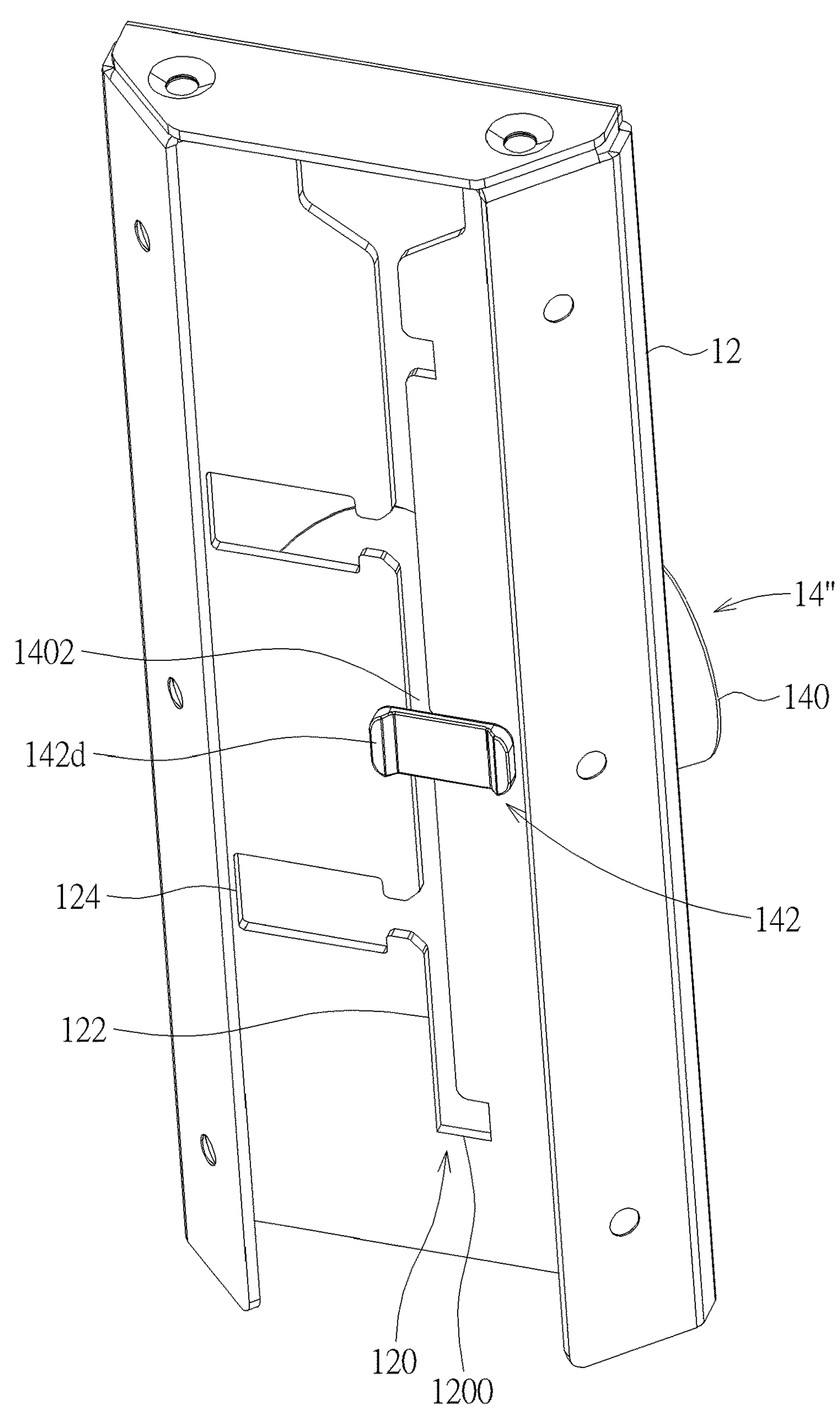
FIG. 12 is a perspective view illustrating the cable clip and the support bracket shown in FIG. 11 from another viewing angle.

Referring to FIGS. 9 to 12, FIG. 9 is a perspective view illustrating a cable clip 14" according to another embodiment of the invention, FIG. 10 is a perspective view illustrating the cable clip 14" shown in FIG. 9 from another viewing angle, FIG. 11 is a perspective view illustrating the cable clip 14" shown in FIG. 9 being fixed on the support bracket 12, and FIG. 12 is a perspective view illustrating the cable clip 14" and the support bracket 12 shown in FIG. 11 from another viewing angle.

The main difference between the cable clip 14" and the aforesaid cable clip 14 is that the retainer 140 of the cable clip 14" is formed in one-piece and with a curved opening 1408, as shown in FIGS. 9 and 10. The curved opening 1408 communicates with the curved accommodation space 1400. Thus, the cable 16 shown in FIG. 1 may be put into the curved accommodation space 1400 through the curved opening 1408. In this embodiment, a ratio of a width W of the curved opening 1408 to a diameter of the cable 16 may be between 1/1.8 and 1/1.5, but the invention is not so limited. For further explanation, a user may push the cable 16 into the curved accommodation space 1400 through the curved opening 1408. Accordingly, the cable 16 may be stably fixed in the curved accommodation space 1400.

In this embodiment, the retainer 140 of the cable clip 14" may further have two guiding portions 1410, wherein the two guiding portions 1410 are located at opposite sides of the curved opening 1408 and are inclined in directions away from each other. The two guiding portions 1410 allow the user to push the cable 16 from the curved opening 1408 into the curved accommodation space 1400 more easily.

As shown in FIG. 10, another difference between the cable clip 14" and the aforesaid cable clip 14 is that the fixing structure 142 of the cable clip 14" comprises a plate 142*d* and a connecting portion 142*c*, wherein the connecting portion 142*c* connects the plate 142*d* and the back 1402 of the retainer 140. As shown in FIGS. 11 and 12, when the cable clip 14" is fixed on the support bracket 12, the support bracket 12 is sandwiched in between the plate 142*d* and the back 1402 of the retainer 140. Accordingly, the cable clip 14" can be fixed on the support bracket 12 by the fixing structure 142. The cable clip 14" may be adjusted to any position on the support bracket 12 by the friction between the pate 142*d*, the back 1402 of the retainer 140, and the support bracket 12. It should be noted that the assembly and disassembly manners of the cable clip 14" are substantially the same as that of the cable clip 14, so the repeated explanation will not be depicted herein again.

In another embodiment, the plate 142*d* may also have the aforesaid first restraining portion 1420 and each of the fixing mechanisms 120 may also have the aforesaid second restraining portion 1202, so as to prevent the cable clip 14" from coming off the installation groove 1200 by using the second restraining portion 1202 to stop the first restraining portion 1420.

As mentioned in the above, the invention utilizes the cable clip curved with a radian to accommodate the cable and fix the bending radius of the cable, so as to ensure the signal quality of the cable. The user may quickly and conveniently assemble and disassemble the cable clip without using additional tools. Furthermore, the user may first arrange the cable with the cable clip outside the chassis and then fix the cable clip on the support bracket in the chassis, so as to increase the operating space when repairing or replacing the cable. Moreover, the cable clip may be clamped at any position on the support bracket by the fixing structure, so as to increase the flexibility of cable management. The cable clip of the invention can be operated easily and does not occupy space, such that the cable clip can be applied to the chassis of different heights.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device comprising:

a chassis;

a support bracket disposed in the chassis; and a cable clip comprising a retainer and a fixing structure, the retainer being curved with a radian and formed with a curved accommodation space having two non-parallel openings along the radian, the fixing structure extending from a back of the retainer, the cable clip being fixed on the support bracket by the fixing structure.

2. The electronic device of claim 1, wherein the retainer comprises a first cover and a second cover, and the first cover is rotatably connected to the second cover, such that the first cover is able to rotate with respect to the second cover to be opened or closed to expose or cover the curved accommodation space.

3. The electronic device of claim 2, wherein the first cover has a first engaging portion and the second cover has a second engaging portion; wherein, when the first cover is closed with respect to the second cover, the first engaging portion engages with the second engaging portion.

4. The electronic device of claim 1, wherein the fixing structure comprises a first plate, a second plate and a connecting portion, the first plate and the second plate are disposed on the connecting portion in parallel, and the support bracket is sandwiched in between the first plate and the second plate.

5. The electronic device of claim 4, wherein the first plate has two first restraining portions, the two first restraining portions are located at opposite sides of the connecting portion, the support bracket has a plurality of fixing mechanisms, each of the plurality of fixing mechanisms is formed with an installation groove and has two second restraining portions, and the two second restraining portions are located at opposite sides of the installation groove; wherein, when the connecting portion of the cable clip is installed in the installation groove, the two second restraining portions stop the two first restraining portions.

6. The electronic device of claim 5, wherein the support bracket is further formed with a longitudinal groove, the longitudinal groove is connected to the installation groove of each of the plurality of fixing mechanisms, and the connecting portion is able to move between the longitudinal groove and the installation groove.

7. The electronic device of claim 6, wherein the support bracket is further formed with at least one quick release groove, the at least one quick release groove is connected to the longitudinal groove, the first plate is able to pass through the at least one quick release groove, and the connecting portion is able to move between the longitudinal groove and the at least one quick release groove.

8. The electronic device of claim 4, wherein the connecting portion is connected to the back of the retainer, and the second plate is spaced a predetermined distance from the back of the retainer.

9. The electronic device of claim 1, wherein the retainer is further formed with a curved opening and the curved opening communicates with the curved accommodation space.

10. The electronic device of claim 9, wherein the retainer further has two guiding portions, and the two guiding portions are located at opposite sides of the curved opening and are inclined in directions away from each other.

11. The electronic device of claim 1, wherein the fixing structure comprises a plate and a connecting portion, the connecting portion connects the plate and the back of the retainer, and the support bracket is sandwiched in between the plate and the back of the retainer.

12. A cable clip comprising:

a retainer, the retainer being curved with a radian and formed with a curved accommodation space having two non-parallel openings along the radian; and a fixing structure extending from a back of the retainer;

wherein the fixing structure comprises a first plate, a second plate and a connecting portion, and the first plate and the second plate are disposed on the connecting portion in parallel.

13. The cable clip of claim 12, wherein the retainer comprises a first cover and a second cover, and the first cover is rotatably connected to the second cover, such that the first cover is able to rotate with respect to the second cover to be opened or closed to expose or cover the curved accommodation space.

14. The cable clip of claim 13, wherein the first cover has a first engaging portion and the second cover has a second engaging portion; wherein, when the first cover is closed with respect to the second cover, the first engaging portion engages with the second engaging portion.

15. The cable clip of claim 12, wherein the first plate has two first restraining portions, and the two first restraining portions are located at opposite sides of the connecting portion.

16. The cable clip of claim 12, wherein the connecting portion is connected to the back of the retainer, and the second plate is spaced a predetermined distance from the back of the retainer.

17. A cable clip comprising:

a retainer, the retainer being curved with a radian and formed with a curved accommodation space having two non-parallel openings along the radian; and a fixing structure extending from a back of the retainer;

wherein the retainer is further formed with a curved opening and the curved opening communicates with the curved accommodation space;

wherein the retainer further has two guiding portions, and the two guiding portions are located at opposite sides of the curved opening and are inclined in directions away from each other.

18. The cable clip of claim 17, wherein the fixing structure comprises a plate and a connecting portion, and the connecting portion connects the plate and the back of the retainer.

* * * * *